(12) United States Patent
Shimomura

(10) Patent No.: US 9,217,778 B2
(45) Date of Patent: Dec. 22, 2015

(54) VOLTAGE MEASURING DEVICE

(71) Applicant: PANASONIC CORPORATION, Osaka (JP)

(72) Inventor: Kazuhiro Shimomura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 172 days.

(21) Appl. No.: 14/142,632

(22) Filed: Dec. 27, 2013

(65) Prior Publication Data

US 2014/0111217 A1   Apr. 24, 2014

Related U.S. Application Data

(63) Continuation of application No. PCT/JP2012/001633, filed on Mar. 9, 2012.

(30) Foreign Application Priority Data

Jun. 29, 2011   (JP) .................. 2011-144150

(51) Int. Cl.
*G01N 27/416* (2006.01)
*G01R 31/36* (2006.01)
*G01R 19/25* (2006.01)

(52) U.S. Cl.
CPC .......... *G01R 31/362* (2013.01); *G01R 19/2503* (2013.01); *G01R 31/3658* (2013.01)

(58) Field of Classification Search
CPC .......................... G01R 31/362; G01R 31/3658
USPC .................. 324/433, 434; 320/116, 134, 163
See application file for complete search history.

(56) References Cited

U.S. PATENT DOCUMENTS

2006/0071643 A1* 4/2006 Carrier et al. ................. 320/132
2009/0066338 A1   3/2009 Yonezawa
(Continued)

FOREIGN PATENT DOCUMENTS

JP   2001-208782 A   8/2001
JP   2009-063511 A   3/2009
(Continued)

OTHER PUBLICATIONS

International Search Report issued in International Application No. PCT/JP2012/001633 mailed Jun. 5, 2012.

*Primary Examiner* — Edward Tso
*Assistant Examiner* — Aaron Piggush
(74) *Attorney, Agent, or Firm* — McDermott Will & Emery LLP

(57) ABSTRACT

A signal processor includes: a plurality of first capacitors provided for respective output terminals of a plurality of multiplexers, the first capacitors having their one ends connected to the respective output terminals of the multiplexers, the first capacitors being charged in accordance with voltages outputted from the respective output terminals; a differential amplifier including an input terminal connected to the other ends of the first capacitors; a second capacitor connected between the input terminal and an output terminal of the differential amplifier; and a second switch connected parallel to the second capacitor. First switches included in at least one of the plurality of multiplexers are configured as high-voltage switches that allow operation at a voltage higher than an operating voltage of first switches included in the other multiplexer or multiplexers.

6 Claims, 7 Drawing Sheets

(56) References Cited

U.S. PATENT DOCUMENTS

| | | |
|---|---|---|
| 2009/0184716 A1 | 7/2009 | Yonezawa |
| 2010/0052656 A1 | 3/2010 | Tanaka et al. |
| 2011/0210747 A1* | 9/2011 | Heo et al. .................. 324/434 |

FOREIGN PATENT DOCUMENTS

| | | |
|---|---|---|
| JP | 2009-174961 A | 8/2009 |
| JP | 2010-060435 A | 3/2010 |

* cited by examiner

VOLTAGE MEASURING DEVICE

This is a continuation application under 35 U.S.C 111(a) of pending prior International Application No.PCT/JP2012/001633, filed on Mar. 9, 2012, which claims priority to Japanese Application No. 2011-144150, filed on Jun. 29, 2011, the disclosures of which Applications are incorporated by reference herein.

BACKGROUND OF THE INVENTION

1. Field of the Invention

The present invention relates to a voltage measuring device for use in measuring the voltage of each battery cell in a battery cell array in which a predetermined number of battery cells are connected in series.

2. Description of the Related Art

Lithium ion batteries, which have a higher output voltage, higher energy density, and higher efficiency than general secondary batteries, are often used as batteries to be installed in hybrid electric vehicles (HEV) and electric vehicles (EV). It is difficult to control charging and discharging of lithium ion batteries, and lithium ion batteries have a risk of explosion and firing. Therefore, in a case where a lithium ion battery is used as an in-vehicle battery, it is particularly important to manage the battery voltage.

There is a known configuration of a voltage measuring device for use in measuring the voltage of such a battery. The known configuration is such that, for battery cells connected in series, the voltage between both ends of each battery cell is measured sequentially (see Japanese Laid-Open Patent Application Publication No. 2009-174961 and Japanese Laid-Open Patent Application Publication No. 2010-60435, for example). FIG. 9 is a circuit diagram showing a schematic configuration of a conventional voltage measuring device. As shown in FIG. 9, a plurality of (n) battery cells $Cj$ ($j=1, \ldots, n$) are connected in series in a battery cell array 101, and in order to measure the voltage of each battery cell $Cj$, a conventional voltage measuring device 110 includes a multiplexer 102 and a signal processor 103. Voltages $VCi$ ($i=0, 1, \ldots, n$) at connecting ends of the plurality of battery cells $Cj$ are inputted to the multiplexer 102, and the multiplexer 102 outputs one of the voltages. Based on the output from the multiplexer 102, the signal processor 103 performs operational processing on the voltage of each battery cell $Cj$. The multiplexer 102 includes pairs of switches SWAi and SWBi. Each one of the pairs of switches SWAi and SWBi is provided corresponding to a respective one of a plurality of first input terminals $Ti$ ($i=0, \ldots, n$). The voltages at the connecting ends of the plurality of battery cells $Cj$ are inputted to the plurality of first input terminals $Ti$. When one switch SWAi is turned on, the voltage at one end of a corresponding battery cell $Cj$ is connected to one of a pair of output terminals TO1 and TO2 (specifically, connected to the output terminal TO1 at the positive phase side). When the other switch SWBi is turned on, the voltage at the one end of the corresponding battery cell $Cj$ is connected to the other one of the pair of output terminals TO1 and TO2 (specifically, connected to the output terminal TO2 at the negative phase side). The signal processor 103 includes: 1) a pair of capacitors 131A and 131B whose one ends are connected to the pair of output terminals TO1 and TO2 of the multiplexer 102, respectively, wherein, the pair of capacitors 131A and 131B are charged in accordance with voltages outputted from the respective output terminals TO1 and TO2; 2) a differential amplifier 130 including a pair of input terminals, which are connected to the other ends of the pair of capacitors 131A and 131B, respectively; 3) a pair of capacitors 132A and 132B connected between the input terminals and output terminals of the differential amplifier 130; and 4) a pair of switches 133A and 133B connected parallel to the pair of capacitors 132A and 132B. That is, the signal processor 103 is configured as a so-called level shifter circuit.

As described above, by means of the multiplexer 102, nodes at both ends of a battery cell $Cj$ are selectively connected to the signal processor 103 via switches SWAi and SWBi corresponding to the nodes, and thereby the voltage of the battery cell $Cj$ is measured. This process is performed on all of the battery cells $Cj$ sequentially, and thereby voltage data of each battery cell $Cj$ is collected. Based on the collected voltage data, control of the battery is performed.

SUMMARY OF THE INVENTION

In such a voltage measuring device as described above, a plurality of (e.g., 10) battery cells $Cj$ are connected in series. Accordingly, if the maximum voltage per battery cell $Cj$ is 5 V, then the upper-side voltage VC10 of the top battery cell C10 is approximately 50 V. For this reason, it is necessary for the multiplexer 102 (especially the switches therein) to be configured as a high breakdown voltage (hereinafter "high-voltage") circuitry whose maximum allowable voltage is 50 V or higher.

Further, there is a case where the voltage measuring device as described above includes, in addition to the battery cell array 101, at least one power supply VA for use in measuring a management voltage, such as a power supply for use in temperature detection, a power supply for use in checking the operation of various sensors, etc. In conventional voltage measuring devices, such a management-voltage-measuring power supply VA is also connected to the single signal processor 103 by means of the single multiplexer 102. That is, in addition to the plurality of input terminals $Ti$ to which the voltages $VCi$ at the connecting ends of the battery cells $Cj$ are inputted, the multiplexer 102 includes: 1) a plurality of input terminals TA and TB, to which voltages VAA and VAB at connecting ends of at least one management-voltage-measuring power supply VA are inputted; and 2) switches SWAA and SWAB connected to the input terminals TA and TB. In recent years, due to system diversification of voltage measuring devices, there is a tendency that the number of such management-voltage-measuring power supplies VA to be incorporated in a voltage measuring device increases.

However, in the conventional art, it is configured such that all voltages to be measured are inputted to a single multiplexer for switching operations. Therefore, it is necessary that a path for performing measurement on the management-voltage-measuring power supply VA be configured as a high breakdown voltage ("high-voltage") circuit. Specifically, for example, if the switch SWA10 or SWB10 corresponding to the upper-side voltage VC10 of the top battery cell C10 is turned ON, the upper-side voltage VC10 of the battery cell C10 will be applied to ends of the switches SWAA and SWBA, because the ends are connected to the output terminals TO1 and TO2, even if the switches SWAA and SWBA corresponding to the management-voltage-measuring power supply VA are in an OFF state. Therefore, if the switches SWAA and SWBA are not configured as high-voltage switches, there is a risk that the switches SWAA and SWAB become destroyed.

The circuit area of a high-voltage switch is larger than that of an ordinary switch (ordinary switches withstand a voltage of approximately 5V). For this reason, if all of the switches of the multiplexer 102 are configured as high-voltage switches, the multiplexer 102 becomes large-sized. It is considered that this problem will be more pronounced in the future since, as mentioned above, there is a recent tendency that the number of management-voltage-measuring power supplies VA to be incorporated in a voltage measuring device increases.

The present invention has been made to solve the above-described conventional problems. An object of the present invention is to provide a voltage measuring device that makes it possible to suppress an increase in circuit area even if there is an increase in the number of management-voltage-measuring power supplies to be incorporated in the voltage measuring device.

A voltage measuring device according to one aspect of the present invention includes: 1) a switching unit configured such that, in order to measure a voltage of each battery cell in a battery cell array in which a plurality of battery cells are connected in series, a) voltages at connecting ends of the plurality of battery cells are inputted to the switching unit, b) a voltage of at least one management-voltage-measuring power supply provided separately from the plurality of battery cells is inputted to the switching unit, and c) the switching unit outputs one of the inputted voltages; and 2) a signal processor configured to perform operational processing on the voltage of each battery cell based on an inter-cell voltage between the plurality of battery cells, the inter-cell voltage being outputted from the switching unit. Wherein, the switching unit includes a plurality of multiplexers each including: 1) a plurality of input terminals; 2) an output terminal configured to output one of voltages inputted from the plurality of input terminals; and 3) a plurality of first switches provided for the respective input terminals and provided between the plurality of input terminals and the output terminal, the plurality of first switches selectively connecting one of the input terminals to the output terminal Wherein, the signal processor includes: 1) a plurality of first capacitors provided for the respective output terminals of the plurality of multiplexers, the first capacitors having their one ends connected to the respective output terminals of the multiplexers, the first capacitors being charged in accordance with voltages outputted from the respective output terminals; 2) a differential amplifier including an inverting input terminal and a non-inverting input terminal, one input terminal of which is connected to the other ends of the first capacitors; 3) a second capacitor connected between the one input terminal and an output terminal of the differential amplifier; and 4) a second switch connected parallel to the second capacitor. Wherein, the first switches included in at least one of the plurality of multiplexers are configured as high-voltage switches that allow operation at a voltage higher than an operating voltage of the first switches included in the other multiplexer or multiplexers.

In the above-described configuration, voltage measurement subjects are divided into a plurality of groups. The multiplexers are provided for the respective groups. In at least one of the plurality of multiplexers, the first switches are configured as high-voltage switches. In the other multiplexer(s), the first switches are configured as ordinary switches. According to this configuration, the multiplexer(s) including only ordinary switches can be applied to the group(s) not subjected to the voltage measurement of battery cells. This makes it possible to suppress an increase in circuit area even if there is an increase in the number of management-voltage-measuring power supplies.

The voltage measuring device may include a voltage disconnector provided between the first switches and the first capacitors, the voltage disconnector being configured such that, when an output from one of the multiplexers is inputted to the differential amplifier, the voltage disconnector disconnects an output from the other multiplexer or multiplexers. Accordingly, when a voltage applied to an input terminal included in one of the multiplexers is transmitted to the signal processor, the connection between the other multiplexer(s) and the signal processor is disconnected. This makes it possible to prevent erroneous operation, thereby performing highly precise voltage measurement.

The voltage disconnector may include third switches configured to cause voltages between the first switches and the first capacitors to become a predetermined reference voltage. Accordingly, when a voltage applied to an input terminal included in one of the multiplexers is transmitted to the signal processor, a voltage applied to the output terminal(s) of the other multiplexer(s) and a voltage applied to the first capacitor(s) corresponding to the output terminal(s) of the other multiplexer(s) become a reference voltage. This prevents the voltage at the first capacitor(s) corresponding to the other multiplexer(s) in which all of the first switches are OFF from varying due to noise or the like. Consequently, the voltage at the first capacitor corresponding to the one multiplexer, the first capacitor being connected to one end of the first capacitor(s) corresponding to the other multiplexer(s), is prevented from varying. This makes it possible to perform highly precise voltage measurement.

The plurality of multiplexers may include: 1) a first multiplexer including a plurality of first input terminals, to which the voltages at all of the connecting ends of the plurality of battery cells in the battery cell array are inputted; and 2) a second multiplexer including at least one second input terminal, to which the voltage of the at least one management-voltage-measuring power supply is inputted. Wherein, the first switches included in the first multiplexer may be configured as high-voltage switches that allow operation at a voltage higher than an operating voltage of the first switches included in the second multiplexer. According to this configuration, a multiplexer including only ordinary switches is applied as the second multiplexer which is not subjected to the battery cell voltage measurement. This makes it possible to suppress an increase in circuit area even if there is an increase in the number of management-voltage-measuring power supplies. Moreover, a single multiplexer is applied as the first multiplexer for use in the battery cell voltage measurement. Accordingly, one of the first capacitors of the signal processor is used as a shared capacitor when a connection is made thereto to measure the voltage at each connecting end of the plurality of battery cells. As a result, when the voltage at each connecting end of the plurality of battery cells is measured, voltage measurement errors that arise when different first capacitors are used in the measurement do not occur. This makes it possible to perform highly precise voltage measurement.

The output terminal of each multiplexer may be configured as a pair of output terminals. Each first switch of the multiplexer may include: a positive-phase-side switch configured to connect or disconnect between one of the plurality of input terminals and one of the pair of output terminals; and a negative-phase-side switch configured to connect or disconnect between the one of the plurality of input terminals and the other one of the pair of output terminals. This configuration makes it possible to measure the voltage between selected input terminals in a manner to invert the polarity. Therefore, the voltage measurement can be performed with a higher precision.

The high-voltage switches may each include at least one high-voltage MOS transistor. The other first switches may each include at least one low-voltage MOS transistor. An area of each high-voltage MOS transistor may be five times or more as large as an area of each low-voltage MOS transistor.

The above and further objects, features, and advantages of the present invention will more fully be apparent from the following detailed description with accompanying drawings.

The present invention is configured as described above, and provides an advantage of making it possible to suppress an increase in circuit area even if there is an increase in the number of management-voltage-measuring power supplies.

DESCRIPTION OF THE PREFERRED EMBODIMENTS

Figure 1:
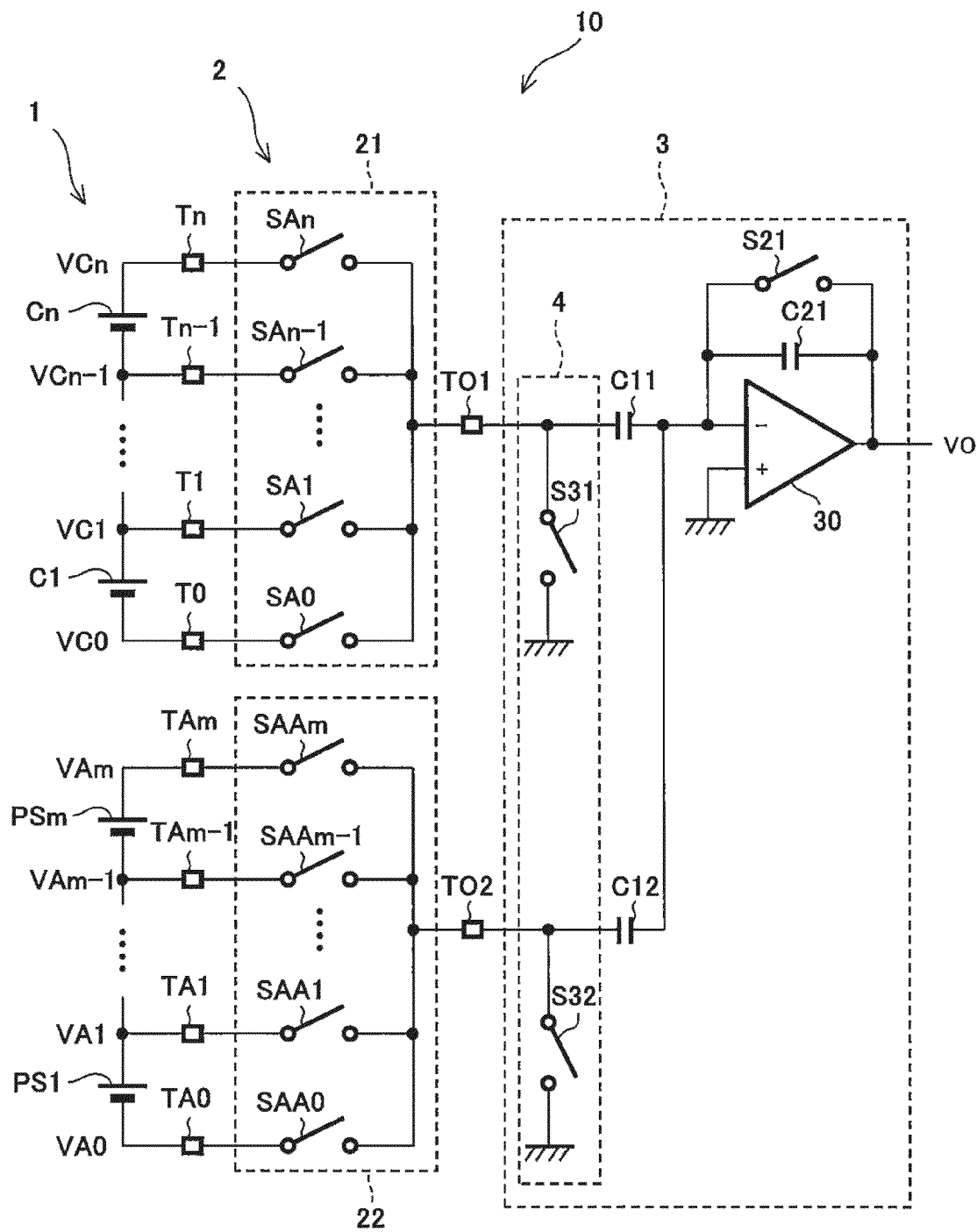
FIG. 1 is a circuit diagram showing an example of a schematic configuration of a voltage measuring device according to Embodiment 1 of the present invention.

Hereinafter, embodiments of the present invention are described with reference to the drawings. In the drawings, the same or corresponding elements are denoted by the same reference signs, and repeating the same descriptions is avoided below.

<Embodiment 1>

First, a voltage measuring device according to Embodiment 1 of the present invention is described. FIG. 1 is a circuit diagram showing an example of a schematic configuration of the voltage measuring device according to Embodiment 1 of the present invention.

As shown in FIG. 1, a plurality of (n) battery cells $C_j$ ($j=1, \ldots, n$) are connected in series in a battery cell array 1, and in order to measure the voltage of each battery cell $C_j$, a voltage measuring device 10 according to the present embodiment includes a switching unit 2 and a signal processor 3. Voltages at connecting ends of the plurality of battery cells $C_j$ are inputted to the switching unit 2, and the switching unit 2 outputs one of the voltages. Based on the output from the switching unit 2, the signal processor 3 performs operational processing on the voltage of each battery cell $C_j$. Not only the voltage at each connecting end of the plurality of battery cells $C_j$ but also a voltage $VA_q$ ($q=0, 1, \ldots, m$) at each connecting end of at least one management-voltage-measuring power supply $PS_p$ ($p=1, \ldots, m$) is inputted to the switching unit 2. Examples of the management-voltage-measuring power supply $PS_p$ include a power supply for use in temperature detection (e.g., a power supply for use in applying a current to a thermistor), a power supply for use in checking the operation of various sensors, and a power supply for use in detecting a current flowing through the battery cell array 1. However, examples of the management-voltage-measuring power supply $PS_p$ are not limited to the above, but include all voltage sources other than the battery cell array 1. For example, in temperature detection, a plurality of power supplies are used in a case where temperatures are detected at a plurality of points.

The switching unit 2 includes a plurality of (in the present embodiment, two) multiplexers 21 and 22. To be more specific, the multiplexers 21 and 22 are a first multiplexer 21 and a second multiplexer 22. The first multiplexer 21 includes a plurality of first input terminals $T_i$, to which voltages $VC_i$ ($i=0, 1, \ldots, n$) at all of the connecting ends of the plurality of battery cells $C_j$ in the battery cell array 1 are inputted. The second multiplexer 22 includes at least one (in the present embodiment, m+1) second input terminal $TA_q$, to which the voltage $VA_q$ of the management-voltage-measuring power supply $PS_p$ is inputted.

The first multiplexer 21 includes: the plurality of first input terminals $T_i$, to which the voltage $VC_i$ ($i=0, 1, \ldots, n$) at each connecting end of each battery cell $C_j$ is inputted; and an output terminal TO1 configured to output one of voltages inputted from the plurality of first input terminals $T_i$. The plurality of first input terminals $T_i$ include first switches (high-voltage first switches which will be described below) $SA_i$ configured to connect or disconnect between the first input terminals $T_i$ and the output terminal TO1. The signal processor 3 is connected to the output terminal TO1. Accordingly, in order to selectively connect the plurality of high-voltage first switches $SA_i$ to the single output terminal TO1, a plurality of paths between the plurality of high-voltage first switches $SA_i$ and the single output terminal TO1 are integrated into a single path.

The second multiplexer 22 includes: the at least one second input terminal $TA_q$, to which the voltage $VA_q$ at each connecting end of the management-voltage-measuring power supply $PS_p$ is inputted; and an output terminal TO2 configured to output one of voltages inputted from the at least one second input terminal $TA_q$. The at least one second input terminal $TA_q$ includes a first switch (a low-voltage first switch which will be described below) $SAA_q$ configured to connect or disconnect between the second input terminal $TA_q$ and the output terminal TO2. The signal processor 3 is connected to the output terminal TO2. Accordingly, in a case where there are a plurality of low-voltage first switches $SAA_q$, in order to selectively connect the plurality of low-voltage first switches $SAA_q$ to the single output terminal TO2, a plurality of paths between the plurality of low-voltage first switches $SAA_q$ and the single output terminal TO2 are integrated into a single path.

The signal processor 3 includes: 1) a plurality of first capacitors C11 and C12 provided for the respective output terminals TO1 and TO2 of the plurality of multiplexers 21 and 22, wherein, a) the first capacitors C11 and C12 have their one ends connected to the respective output terminals TO1 and TO2 of the multiplexers 21 and 22, and b) the first capacitors C11 and C12 are charged in accordance with voltages outputted from the respective output terminals TO1 and TO2; 2) a differential amplifier 30 including an inverting input terminal and a non-inverting input terminal, one input terminal of which is connected to the other ends of the first capacitors C11 and C12; 3) a second capacitor C21 connected between the one input terminal and an output terminal of the differential amplifier 30; and 4) a second switch S21 connected parallel to the second capacitor C21. Wherein, the non-inverting input terminal of the differential amplifier 30 is connected to a reference voltage, and the inverting input terminal of the differential amplifier 30 is connected to the second capacitor C21.

In the present embodiment, the voltage measuring device 10 includes a voltage disconnector 4 provided between the first switches SAi, SAAq and the first capacitors C11, C12. The voltage disconnector 4 is configured such that, when an output from one of the multiplexers 21 and 22 is inputted to the differential amplifier 30, the voltage disconnector 4 disconnects an output from the other one of the multiplexers 21 and 22. Specifically, the voltage disconnector 4 includes third switches S31 and S32 configured to cause voltages between the first switches SAi, SAAq and the first capacitors C11, C12 to become a predetermined reference voltage (ground voltage). While one of the high-voltage first switches SAi is ON, the third switch S32 at the low-voltage first switch SAAq side is OFF. While one of the low-voltage first switches SAAq is ON, the third switch S31 at the high-voltage first switch SAi side is OFF.

The ON state and OFF state of each of the first switches SAi, SAAq, the second switch S21, and the third switches S31, S32 are controlled by a controller (not shown), which is an external or internal microcontroller, for example.

Figure 2:
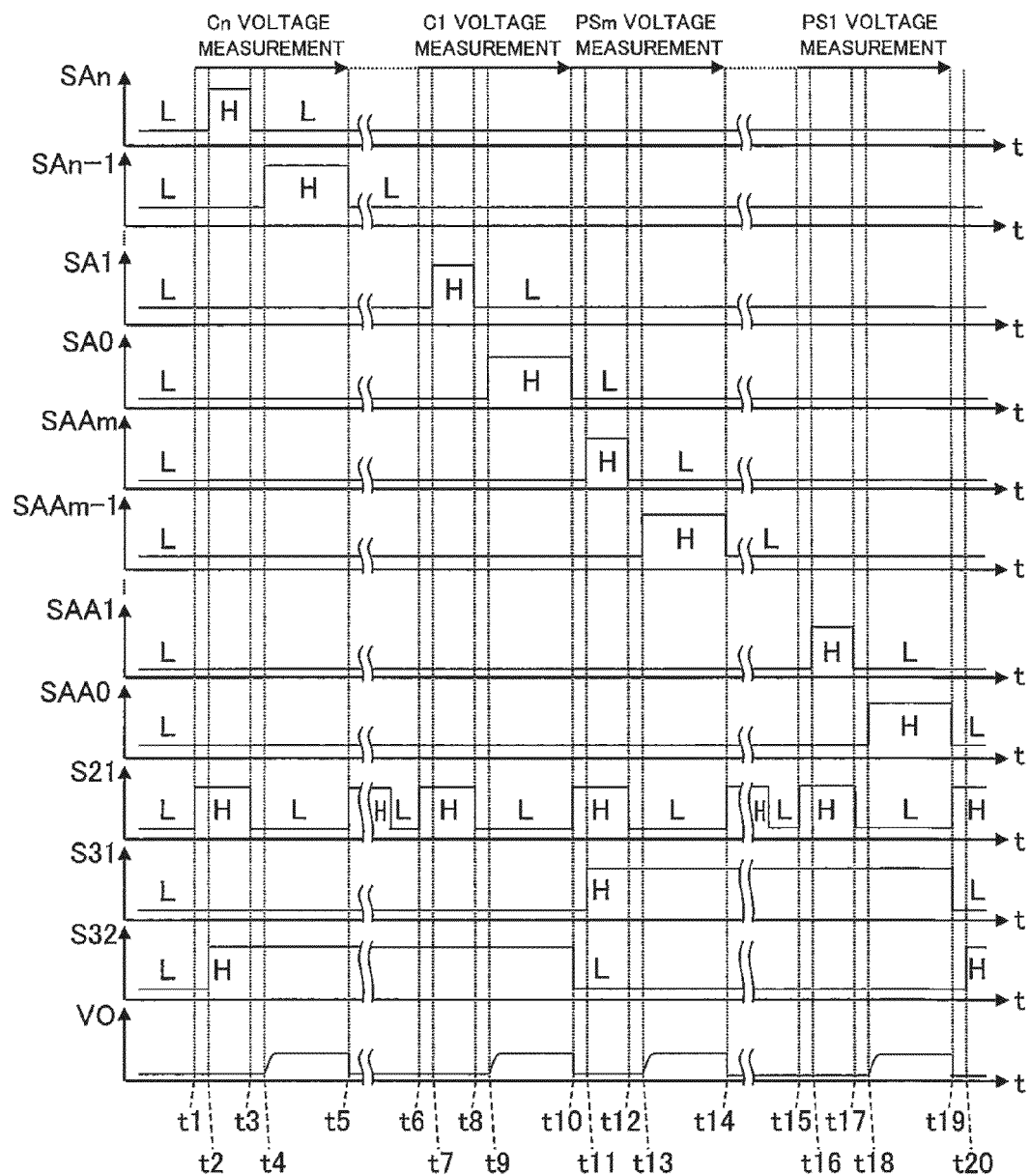
FIG. 2 is a graph showing operating states of respective switches in the voltage measuring device shown in FIG. 1 and temporal changes in an output voltage caused by the operating states of the switches.

Hereinafter, operations of the voltage measuring device 10 having the above configuration are described. FIG. 2 is a graph showing operating states of the respective switches in the voltage measuring device 10 shown in FIG. 1 and temporal changes in an output voltage VO caused by the operating states of the switches. As shown in FIG. 2, a voltage signal that is either a first voltage level L or a second voltage level H higher than the first voltage level L is applied to each switch. When the first voltage level L is applied to a switch, the switch is turned OFF (disconnected). When the second voltage level H is applied to a switch, the switch is turned ON (connected).

A period from a time t1 to a time t5 indicates a period during which measurement is performed on a battery cell Cn. In an initial state, all of the switches are in an OFF state. First, at the time t1, the second switch S21 is turned ON (connected), and thereby electric charge is discharged from the first capacitors C11, C12, and the second capacitor C21, so that the output voltage VO from the differential amplifier 30 becomes 0. Thereafter, at the time t2, the third switch S32 at the second multiplexer 22 side is turned ON, and a first switch SAn of the first multiplexer 21 is turned ON, the first switch SAn corresponding to a first input terminal Tn to which the upper-side voltage VCn of the battery cell Cn is inputted. As a result, the upper-side voltage VCn of the battery cell Cn is outputted to the output terminal TO1 via the first input terminal Tn and the switch SAn. The first capacitor C11 is charged in accordance with the upper-side voltage VCn outputted from the output terminal TO1. At the time, the voltage at the output of the second multiplexer 22 and the voltage at the first capacitor C12 corresponding to the output of the second multiplexer 22 are the reference voltage (ground voltage) since the third switch S32 is ON. This prevents the voltage at the first capacitor C12 from varying due to noise or the like, and prevents the voltage at the first capacitor C11 connected to one end of the first capacitor C12 from varying. It should be noted that the third switch S32 maintains its ON state while the voltages VCi of the plurality of battery cells Cj are being measured (i.e., while switching operations in the first multiplexer 21 are continuing).

Thereafter, the second switch S21 and the first switch SAn are turned OFF at the time t3. Then, at the time t4, a first switch SAn-1 is turned ON, the first switch SAn-1 corresponding to a first input terminal Tn-1 to which the lower-side voltage VCn-1 of the battery cell Cn is inputted. As a result, the lower-side voltage VCn-1 of the battery cell Cn is outputted to the output terminal TO1 via the first input terminal Tn-1 and the switch SAn-1. Accordingly, electric charge corresponding to a voltage decrease from the upper-side voltage VCn to the lower-side voltage VCn-1 is discharged from the first capacitor C11, such that electric charge corresponding to the lower-side voltage VCn-1 is stored in the first capacitor C11. At the time, the electric charge corresponding to the voltage decrease moves from the first capacitor C11 to the second capacitor C21 since the second switch S21 is OFF.

In the above manner, a differential voltage from the upper-side voltage VCn to the lower-side voltage VCn-1, i.e., the voltage of the battery cell Cn, is applied to the second capacitor C21. Then, the applied voltage is outputted as the output voltage VO from the differential amplifier 30. At the time t5, the first switch SAn-1 is turned OFF and the second switch S21 is turned ON, and thereby electric charge is discharged from the first capacitor C11 and the second capacitor C21, so that the switches are reset to the initial state. Thereafter, the voltages of the other battery cells Cj are sequentially measured in the same manner (e.g., the voltage of a battery cell C1 is measured in a period from a time t6 to a time t10).

The following period from the time t10 to a time t14 indicates a period during which measurement is performed on a management-voltage-measuring power supply PSm. At the time t10, the second switch S21 is turned ON to discharge electric charge from the first capacitors C11, C12 and the second capacitor C21, so that the switches are reset to the initial state. Also, the third switch S32 corresponding to the second multiplexer 22 is turned OFF. Thereafter, at the time t11, the third switch S31 corresponding to the first multiplexer 21 is turned ON, and a first switch SAAm is turned ON, the first switch SAAm corresponding to a second input terminal TAm to which the upper-side voltage VAm of the management-voltage-measuring power supply PSm is inputted. As a result, the upper-side voltage VAm of the management-voltage-measuring power supply PSm is outputted to the output terminal TO2 via the input terminal TAm and the switch SAAm. The first capacitor C12 is charged in accordance with the upper-side voltage VAm outputted from the output terminal TO2. At the time, the voltage at the output of the first multiplexer 21 and the voltage at the first capacitor C11 corresponding to the output of the first multiplexer 21 are the reference voltage (ground voltage) since the third switch S31 is ON. This prevents the voltage at the first capacitor C11 from varying due to noise or the like, and prevents the voltage at the first capacitor C12 connected to one end of the first capacitor C11 from varying. It should be noted that the third switch S31 maintains its ON state while the voltages VAq of the plurality of management-voltage-measuring power supplies PSp are being measured (i.e., while switching operations in the second multiplexer 22 are continuing).

From the time t12 to the time t14, similar to the period from the time t3 to the time t5, the lower-side voltage VAm-1 of the management-voltage-measuring power supply PSm is applied to the first capacitor C12. As a result, a differential voltage from the upper-side voltage VAm to the lower-side voltage VAm-1 is applied to the second capacitor C21. Then, the applied voltage is outputted as the output voltage VO from the differential amplifier 30. Thereafter, the voltages of the other management-voltage-measuring power supplies PSp are measured sequentially in the same manner. For example, the voltage of a management-voltage-measuring power supply PS1 is measured in a period from a time t15 to a time t20.

In the present embodiment, the first switches SAi included in at least one of the plurality of multiplexers 21 and 22 (i.e., at least the first multiplexer 21) are configured as high-voltage switches that allow operation at a voltage higher than the operating voltage of the first switches SAAq included in the other (second) multiplexer 22. Accordingly, the capacity of the first capacitor C11 connected to the first multiplexer 21 is higher than the capacity of the first capacitor C12 connected to the second multiplexer 22. Specifically, the low-voltage first switches SAAq have ordinary voltage-withstanding performance, i.e., withstanding approximately 5 V. The high-voltage first switches SAi include switches larger than the low-voltage first switches SAAq. Generally speaking, the high-voltage first switches SAi withstand approximately 20 V or higher.

In the above-described configuration, voltage measurement subjects are divided into a plurality of groups. The multiplexers 21 and 22 are provided for the respective groups. In at least one of the plurality of multiplexers 21 and 22, i.e., in at least the multiplexer 21, the first switches SAi are configured as high-voltage switches. In the other multiplexer 22, the first switches SAAq are configured as ordinary switches. According to this configuration, the multiplexer 22 including only ordinary switches can be applied to the group not subjected to the voltage measurement of battery cells Cj. This makes it possible to suppress an increase in circuit area even if there is an increase in the number of management-voltage-measuring power supplies PSp.

In particular, in the present embodiment, the multiplexers are divided into the first multiplexer 21 which is configured to switch the connections of the battery cells Cj and the second multiplexer 22 which is not intended for the battery cell voltage measurement. A multiplexer including only ordinary switches is applied as the second multiplexer 22. The management-voltage-measuring power supply does not require high voltage-withstanding performance, because, even if there are a plurality of management-voltage-measuring power supplies, these power supplies need not be connected in series to each other. Therefore, even if the number of management-voltage-measuring power supplies PSp increases, the entire multiplexer 22 can be configured with switches and capacitors having low voltage-withstanding performance. This makes it possible to suppress an increase in circuit area. Moreover, a single multiplexer is applied as the first multiplexer 21 for use in the battery cell voltage measurement. Accordingly, the first capacitor C11 of the signal processor 3 is used as a shared capacitor when a connection is made thereto to measure the voltage VCi at each connecting end of the plurality of battery cells Cj. As a result, when the voltage VCi at each connecting end of the plurality of battery cells Cj is measured, voltage measurement errors that arise when different first capacitors are used in the measurement do not occur. This makes it possible to perform highly precise voltage measurement.

Furthermore, the voltage measuring device 10 includes the voltage disconnector 4 which is configured such that the voltage disconnector 4 disconnects an output from one of the multiplexers 21 and multiplexers 22 when an output from the other one of the multiplexers 21 and multiplexers 22 is inputted to the differential amplifier 30. Accordingly, when a voltage applied to an input terminal included in one of the multiplexers 21 and 22 is transmitted to the signal processor 3, the connection between the other one of the multiplexers 21 and 22 and the signal processor 3 is disconnected. That is, a voltage applied to the output terminal of the other one of the multiplexers 21 and 22 becomes the reference voltage. This makes it possible to prevent effectively erroneous operation, thereby performing highly precise voltage measurement.

Figure 3:
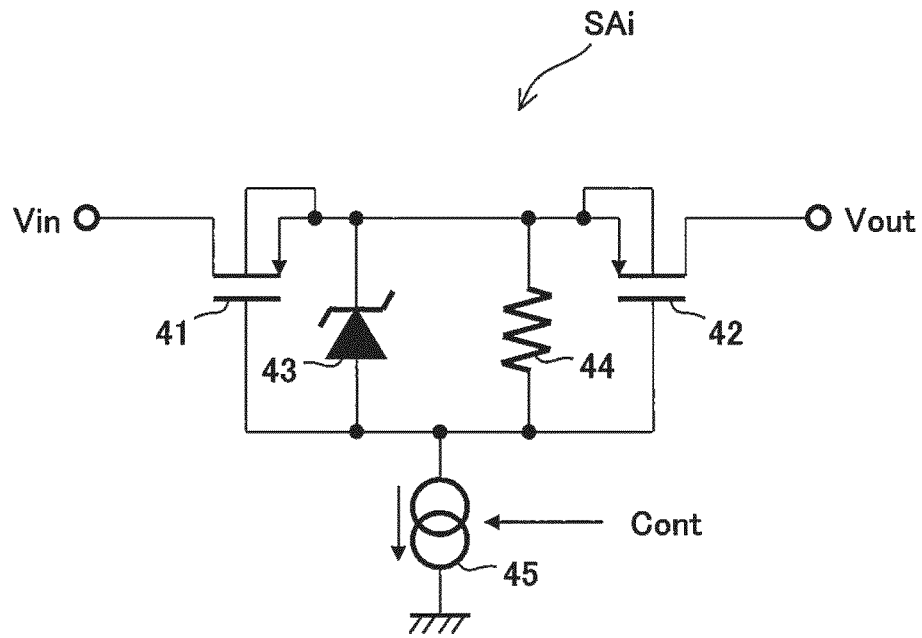
FIG. 3 is a circuit diagram showing a high-voltage switch in the voltage measuring device shown in FIG. 1.
Figure 4:
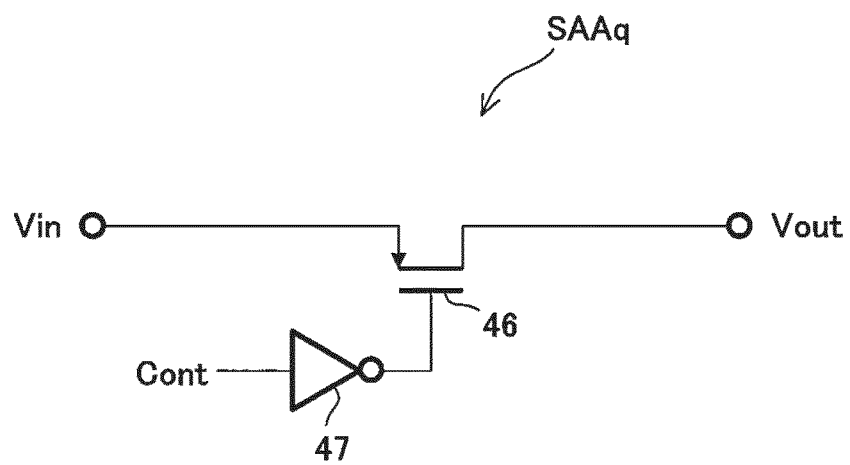
FIG. 4 is a circuit diagram showing a low-voltage switch in the voltage measuring device shown in FIG. 1.

Switching elements having the same shape as that of the low-voltage switches but having a larger size (i.e., larger allowable voltage) than that of the low-voltage switches may be applied as the high-voltage switches. Alternatively, switches having a different structure (circuit configuration) from that of the low-voltage switches may be used as the high-voltage switches. FIG. 3 is a circuit diagram showing a high-voltage switch in the voltage measuring device shown in FIG. 1. FIG. 4 is a circuit diagram showing a low-voltage switch in the voltage measuring device shown in FIG. 1. It should be noted that the high-voltage switch in FIG. 3 has the same circuit configuration as the circuit configuration shown in FIG. 3(A) in Japanese Laid-Open Patent Application Publication No. 2010-60435.

As shown in FIG. 3, each high-voltage first switch SAi includes two P-channel MOS transistors (high-voltage MOS transistors) 41 and 42. For example, the high-voltage MOS transistors 41 and 42 are configured as P-channel LD (Laterally Diffused) MOS transistors, which have a structure capable of withstanding high voltages. The high-voltage MOS transistors 41 and 42 have their sources connected to each other. An input voltage Vin is applied to the drain of the high-voltage MOS transistor 41, and the voltage at the drain of the high-voltage MOS transistor 42 is outputted as an output voltage Vout. A constant voltage element 43 and a resistor element 44 are connected between the sources and gates of the high-voltage MOS transistors 41 and 42. The constant voltage element 43 is configured as a Zener diode, for example. A current source 45, which supplies a common driving current (a current flowed from the gates to the ground), is connected to the gates of the high-voltage MOS transistors 41 and 42. The current supply from the current source 45 is controlled by a control signal Cont from a controller (not shown).

In the high-voltage first switch SAi configured as above, when a driving current is generated from the current source 45 in accordance with the control signal Cont, the current flows through the resistor element 44, and a potential difference occurs between the gate and source of each of the high-voltage MOS transistors 41 and 42. Owing to the potential difference, both of the two high-voltage MOS transistors 41 and 42 are turned ON, so that the high-voltage first switch SAi is turned ON. At the time, the gate-source voltage is set to the maximum value by means of the constant voltage element 43 (by means of the forward voltage of the Zener diode).

As shown in FIG. 4, each low-voltage first switch SAAq includes one P-channel MOS transistor (low-voltage MOS transistor) 46. The high-voltage MOS transistors 41 and 42 are formed through general semiconductor processing, and the area of each of the high-voltage MOS transistors 41 and 42 is approximately five times or more as large as the area of one low-voltage MOS transistor 46. An input voltage Vin is applied to the source of the low-voltage MOS transistor 46, and a voltage applied to the drain of the low-voltage MOS transistor 46 is outputted as an output voltage Vout. An inverter 47 configured to invert a control signal Cont is connected to the gate of the low-voltage MOS transistor 46.

In the low-voltage first switch SAAq configured as above, if the voltage level of the control signal Cont is L level indicating OFF of the low-voltage first switch SAAq, then a voltage of H level higher than L level is applied to the gate of the low-voltage MOS transistor 46 by the inverter 47. As a result, the low-voltage MOS transistor 46 is turned OFF, so that the low-voltage first switch SAAq is turned OFF. On the other hand, if the voltage level of the control signal Cont is H level (>L level) indicating ON of the low-voltage first switch SAAq, then a voltage of L level is applied to the gate of the low-voltage MOS transistor 46 by the inverter 47. As a result, the low-voltage MOS transistor 46 is turned ON, so that the low-voltage first switch SAAq is turned ON.

As described above, the high-voltage first switch SAi has such a circuit configuration as shown in FIG. 3, and the low-voltage first switch SAAq has such a circuit configuration as shown in FIG. 4. Accordingly, the circuit area of the high-voltage first switch SAi including its controller is approximately 10 times or more as large as the circuit area of the low-voltage first switch SAAq including its controller. Therefore, as described above, the circuit area of the entire voltage measuring device 10 can be reduced by reducing the number of high-voltage first switches SAi as much as possible.

<Variation of Embodiment 1>

Next, a variation of Embodiment 1 of the present invention is described. In this variation, the high-voltage first switch SAi applied in Embodiment 1 is replaced by a high-voltage first switch SAi-2 which includes two N-channel MOS transistors (high-voltage MOS transistors), and the low-voltage first switch SAAq applied in Embodiment 1 is replaced by a low-voltage first switch SAAq-2 which includes one N-channel MOS transistor (low-voltage MOS transistor).

Figure 5:
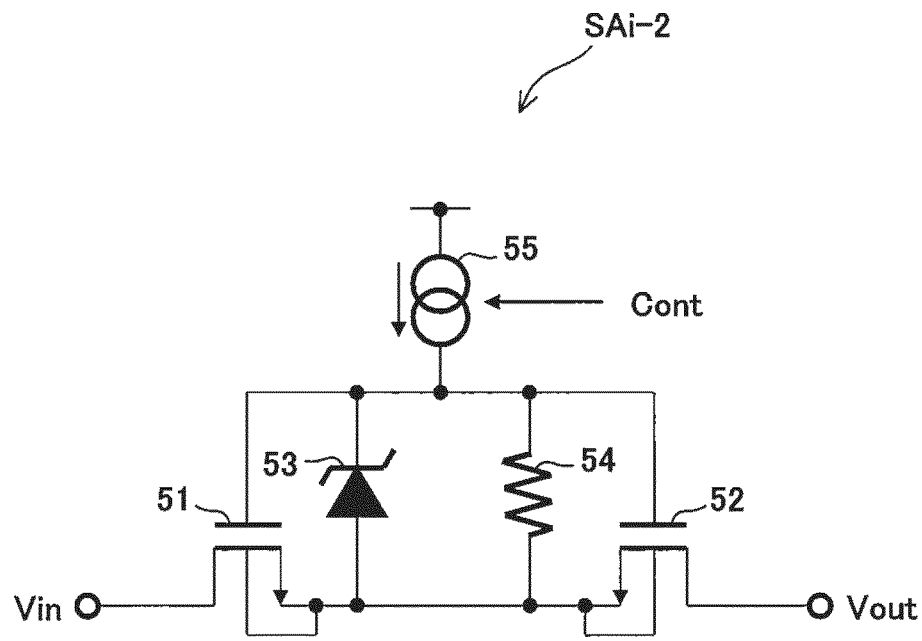
FIG. 5 is a circuit diagram showing another example of the high-voltage switch according to a variation of Embodiment 1 of the present invention.
Figure 6:
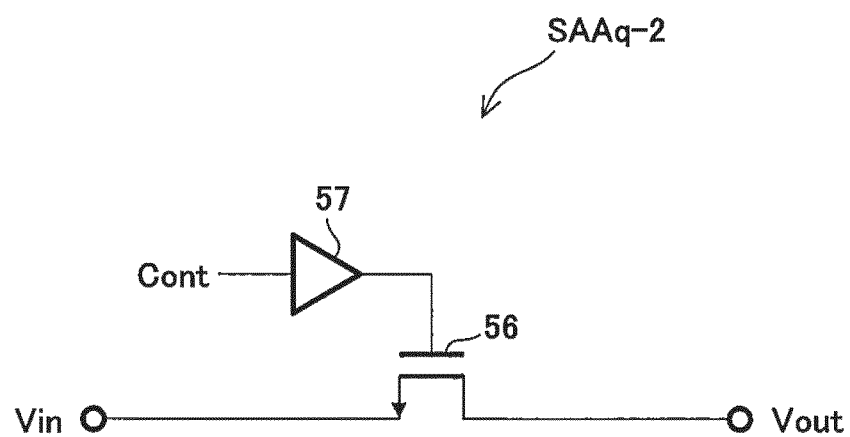
FIG. 6 is a circuit diagram showing another example of the low-voltage switch according to the variation of Embodiment 1 of the present invention.

FIG. 5 is a circuit diagram showing another example of the high-voltage switch according to the variation of Embodiment 1 of the present invention. FIG. 6 is a circuit diagram showing another example of the low-voltage switch according to the variation of Embodiment 1 of the present invention. It should be noted that the high-voltage switch in FIG. 5 has the same circuit configuration as the circuit configuration shown in FIG. 2(A) of Japanese Laid-Open Patent Application Publication No. 2010-60435.

As shown in FIG. 5, the high-voltage first switch SAi-2 includes two N-channel MOS transistors (high-voltage MOS transistors) 51 and 52. For example, the high-voltage MOS transistors 51 and 52 are configured as N-channel LD (Laterally Diffused) MOS transistors, which have a structure capable of withstanding high-voltages. The high-voltage MOS transistors 51 and 52 have their sources connected to each other. An input voltage Vin is applied to the drain of the high-voltage MOS transistor 51, and the voltage at the drain of the high-voltage MOS transistor 52 is outputted as an output voltage Vout. A constant voltage element 53 and a resistor element 54 are connected between the sources and gates of the high-voltage MOS transistors 51 and 52. The constant voltage element 53 is configured as a Zener diode, for example. A current source 55, which supplies a common driving current (a current flowed to the gates from a predetermined power supply voltage), is connected to the gates of the high-voltage MOS transistors 51 and 52. The current supply from the current source 55 is controlled by a control signal Cont from a controller (not shown).

In the high-voltage first switch SAi-2 configured as above, when a driving current is generated from the current source 55 in accordance with the control signal Cont, the current flows through the resistor element 54, and a potential difference occurs between the gate and source of each of the high-voltage MOS transistors 51 and 52. Owing to the potential difference, both of the two high-voltage MOS transistors 51 and 52 are turned ON, so that the high-voltage first switch SAi-2 is turned ON. At the time, the gate-source voltage is set to the maximum value by means of the constant voltage element 53 (by means of the forward voltage of the Zener diode).

The low-voltage first switch SAAq-2 includes one N-channel MOS transistor (low-voltage MOS transistor) 56. The high-voltage MOS transistors 51 and 52 are formed through general semiconductor processing, and the area of each of the high-voltage MOS transistors 51 and 52 is approximately five times or more as large as the area of one low-voltage MOS transistor 56. An input voltage Vin is applied to the source of the low-voltage MOS transistor 56, and a voltage applied to the drain of the low-voltage MOS transistor 56 is outputted as an output voltage Vout. A control signal Cont is inputted to the gate of the low-voltage MOS transistor 56 via a buffer 57.

In the low-voltage first switch SAAq-2 configured as above, if the voltage level of the control signal Cont is L level indicating OFF of the low-voltage first switch SAAq-2, then a voltage of L level is applied to the gate of the low-voltage MOS transistor 56 via the buffer 57. As a result, the low-voltage MOS transistor 56 is turned OFF, so that the low-voltage first switch SAAq-2 is turned OFF. On the other hand, if the voltage level of the control signal Cont is H level (>L level) indicating ON of the low-voltage first switch SAAq-2, then a voltage of H level is applied to the gate of the low-voltage MOS transistor 56 via the buffer 57. As a result, the low-voltage MOS transistor 56 is turned ON, so that the low-voltage first switch SAAq-2 is turned ON.

As described above, the high-voltage first switch SAi is replaced by such a circuit configuration as shown in FIG. 5 (i.e., replaced by the high-voltage first switch SAi-2), and the low-voltage first switch SAAq is replaced by such a circuit configuration as shown in FIG. 6 (i.e., replaced by the low-voltage first switch SAAq-2). Also in this case, the circuit area of the high-voltage first switch SAi-2 including its controller is approximately 10 times or more as large as the circuit area of the low-voltage first switch SAAq-2 including its controller. Therefore, as described above, the circuit area of the entire voltage measuring device 10 can be reduced by reducing the number of high-voltage first switches SAi-2 as much as possible.

<Embodiment 2>

Figure 7:
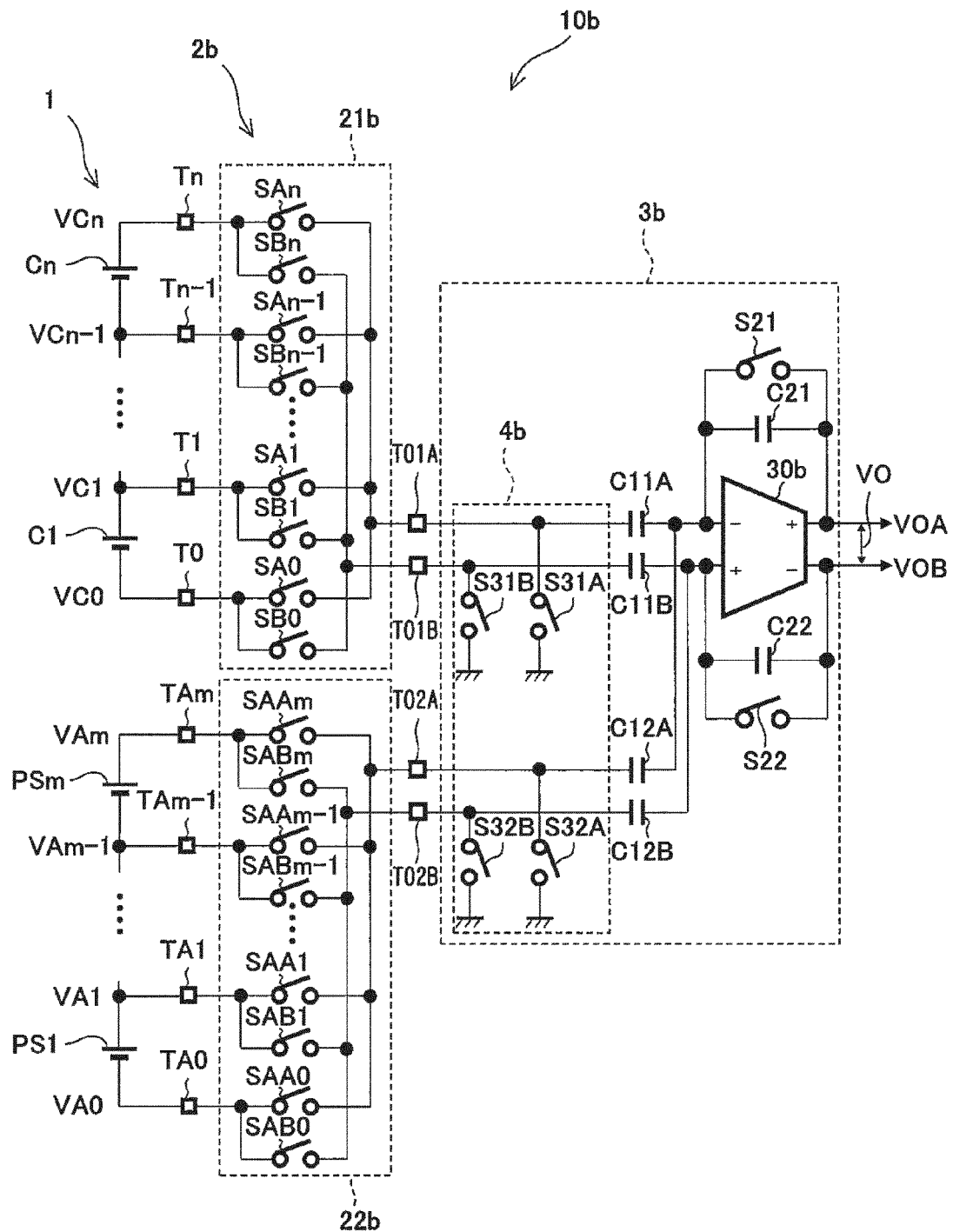
FIG. 7 is a circuit diagram showing an example of a schematic configuration of a voltage measuring device according to Embodiment 2 of the present invention.

Next, a voltage measuring device according to Embodiment 2 of the present invention is described. FIG. 7 is a circuit diagram showing an example of a schematic configuration of the voltage measuring device according to Embodiment 2 of the present invention. In Embodiment 2, the same components as those described in Embodiment 1 are denoted by the same reference signs as those used in Embodiment 1, and a description of such components is omitted. As shown in FIG. 7, a voltage measuring device 10b according to Embodiment 2 is different from the voltage measuring device 10 according to Embodiment 1 in that, in the voltage measuring device 10b according to Embodiment 2, each first input terminal Ti is configured to be connectable to both of positive and negative phases.

Specifically, in a switching unit 2b, a first multiplexer 21b includes an output terminal configured as a pair of output terminals TO1A and TO1B. Each first switch in the first multiplexer 21b and a corresponding third switch in a voltage disconnector 4b each include: 1) a positive-phase-side switch configured to connect or disconnect between one of the plurality of first input terminals Ti and one output terminal TO1A out of the pair of output terminals TO1A and TO1B; and 2) a negative-phase-side switch configured to connect or disconnect between the one of the plurality of first input terminals Ti and the other output terminal TO1B out of the pair of output terminals TO1A and TO1B. Specifically, the first switch includes a positive-phase-side first switch SAn and a negative-phase-side first switch SBn, and the corresponding third switch includes a positive-phase-side third switch S31A and a negative-phase-side third switch S31B.

Similarly, in the switching unit $2b$, a second multiplexer $22b$ includes an output terminal configured as a pair of output terminals TO2A and TO2B. Each first switch in the second multiplexer $22b$ and a corresponding third switch in the voltage disconnector $4b$ each include: 1) a positive-phase-side switch configured to connect or disconnect between one of the plurality of second input terminals TAq and one output terminal TO2A out of the pair of output terminals TO2A and TO2B; and 2) a negative-phase-side switch configured to connect or disconnect between the one of the plurality of second input terminals TAq and the other output terminal TO2B out of the pair of output terminals TO2A and TO2B. Specifically, the first switch includes a positive-phase-side first switch SAAm and a negative-phase-side first switch SABm, and the corresponding third switch includes a positive-phase-side third switch S32A and a negative-phase-side third switch S32B.

In accordance with the above configuration, first capacitors of a signal processor $3b$ include: 1) a positive-phase-side first capacitor C11A and a negative-phase-side first capacitor C11B corresponding to the pair of output terminals TO1A and TO1B of the first multiplexer $21b$; and 2) a positive-phase-side first capacitor C12A and a negative-phase-side first capacitor C12B corresponding to the pair of output terminals TO2A and TO2B of the second multiplexer $22b$. Further, in the signal processor $3b$, a second switch includes a positive-phase-side second switch S21 and a negative-phase-side second switch S22, and a second capacitor includes a positive-phase-side second capacitor C21 and a negative-phase-side second capacitor C22. A positive-phase-side path is connected to an inverting input terminal of a differential amplifier $30b$, and a negative-phase-side path is connected to a non-inverting input terminal of the differential amplifier $30b$. The positive-phase-side second capacitor C21 and the positive-phase-side second switch S21 are connected between the inverting input terminal and a non-inverting output terminal of the differential amplifier $30b$, and the negative-phase-side second capacitor C22 and the negative-phase-side second switch S22 are connected between the non-inverting input terminal and an inverting output terminal of the differential amplifier $30b$. Thus, the signal processor $3b$ is configured as a so-called level shifter circuit.

Figure 8:
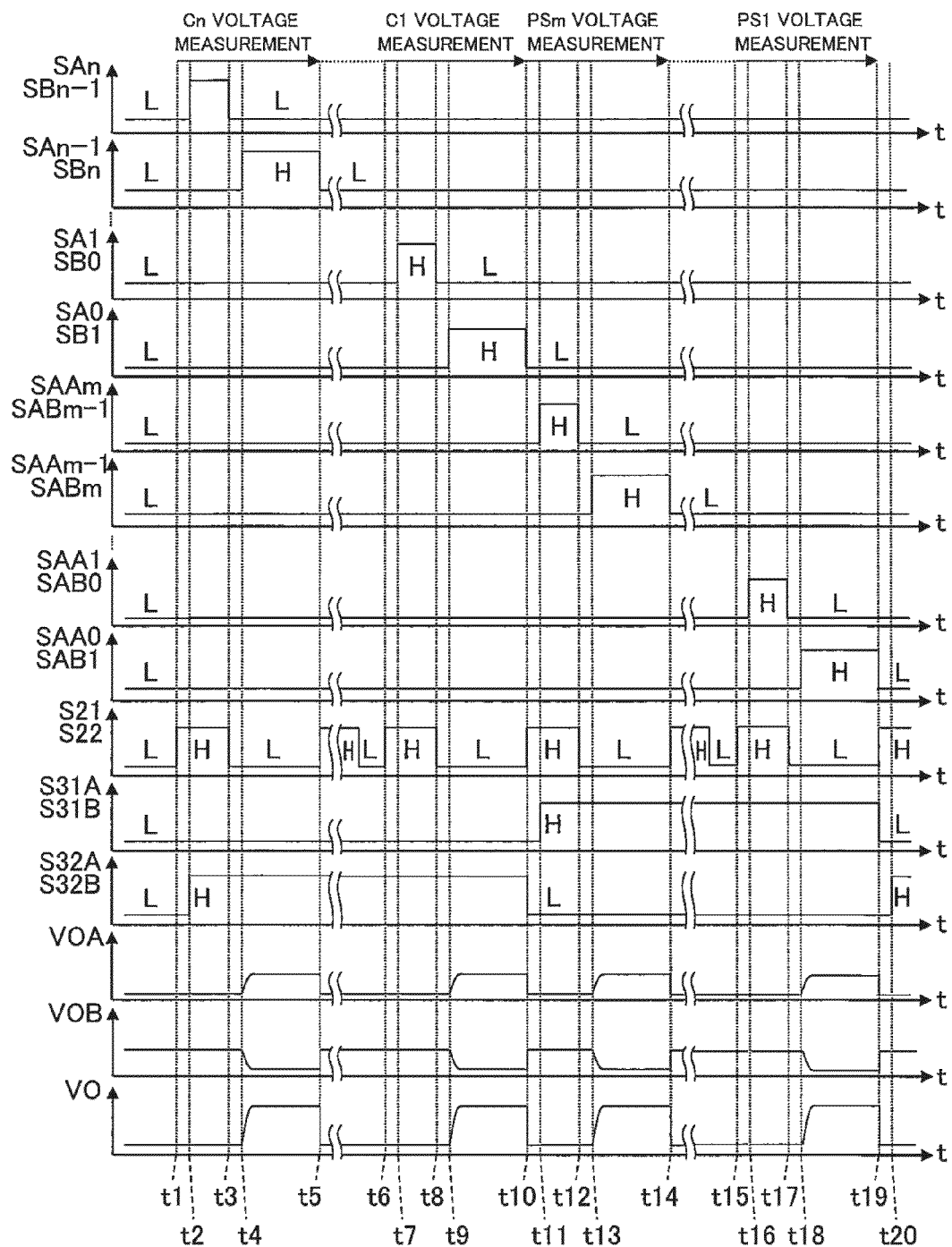
FIG. 8 is a graph showing operating states of respective switches in the voltage measuring device shown in FIG. 7 and temporal changes in an output voltage caused by the operating states of the switches.
Figure 9:
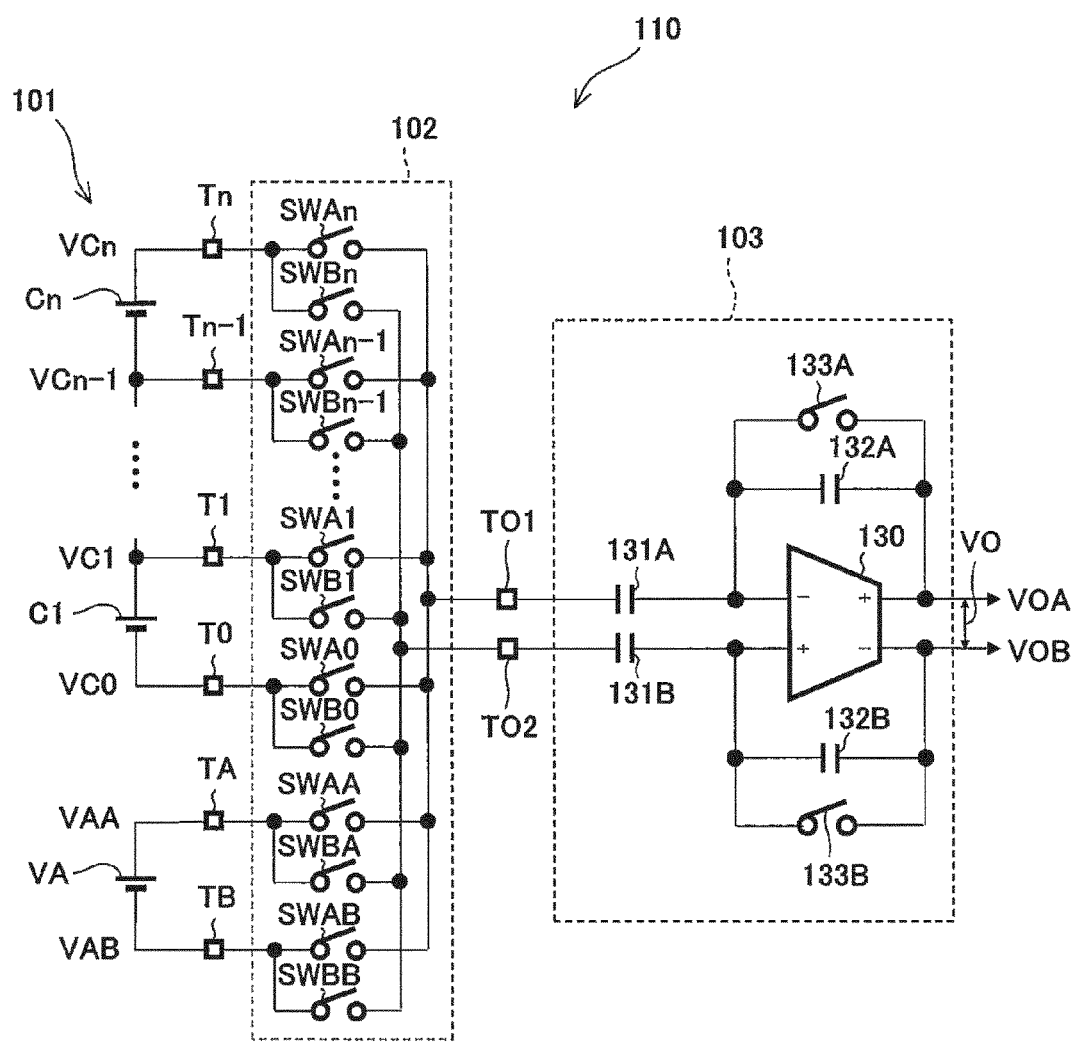
FIG. 9 is a circuit diagram showing a schematic configuration of a conventional voltage measuring device.

Hereinafter, operations of the voltage measuring device $10b$ having the above configuration are described. FIG. 8 is a graph showing operating states of the respective switches in the voltage measuring device $10b$ shown in FIG. 7 and temporal changes in an output voltage VO caused by the operating states of the switches. As shown in FIG. 8, a voltage signal that is either a first voltage level L or a second voltage level H higher than the first voltage level L is applied to each switch. When the first voltage level L is applied to a switch, the switch is turned OFF (disconnected). When the second voltage level H is applied to a switch, the switch is turned ON (connected).

A period from a time t1 to a time t5 indicates a period during which measurement is performed on a battery cell Cn. In an initial state, all of the switches are in an OFF state. First, at the time t1, the second switches S21 and S22 are turned ON (connected), and thereby electric charge is discharged from the first capacitors C11A, C11B, C12A, C12B and the second capacitors C21, C22, so that the output voltage VO from the differential amplifier $30b$ (i.e., a positive-phase-side output voltage VOA and a negative-phase-side output voltage VOB) becomes 0. Thereafter, at the time t2, the third switches S32A and S32B at the second multiplexer $22b$ side are turned ON. Further, the positive-phase-side first switch SAn of the first multiplexer $21b$ is turned ON, wherein the positive-phase-side first switch SAn corresponds to a first input terminal Tn to which the upper-side voltage VCn of the battery cell Cn is inputted. In addition, a negative-phase-side first switch SBn-1 of the first multiplexer $21b$ is turned on, wherein the negative-phase-side first switch SBn-1 corresponds to a first input terminal Tn-1 to which the lower-side voltage VCn-1 of the battery cell Cn is inputted.

As a result, the upper-side voltage VCn of the battery cell Cn is outputted to the output terminal TO1A via the first input terminal Tn and the switch SAn, and the lower-side voltage VCn-1 of the battery cell Cn is outputted to the output terminal TO1B via the first input terminal Tn-1 and the switch SBn-1. The first capacitors C11A and C11B are charged in accordance with the voltages VCn and VCn-1 outputted from the respective output terminals TO1A and TO1B. At the time, the voltages at the outputs of the second multiplexer $22b$ and the voltages at the first capacitors C12A and C12B corresponding to the outputs of the second multiplexer $22b$ are the reference voltage (ground voltage) since the third switches S32A and S32B are ON. This prevents the voltages at the first capacitors C12A and C12B from varying due to noise or the like, and prevents the voltages at the first capacitors C11A and C11B connected to one ends of the first capacitors C12A and C12B from varying. It should be noted that the third switches S32A and S32B maintain their ON state while the voltages VCi of the plurality of battery cells Cj are being measured (i.e., while switching operations in the first multiplexer $21b$ are continuing).

Thereafter, the second switches S21, S22 and the first switches SAn, SBn-1 are turned OFF at the time t3. Then, at the time t4, a positive-phase-side first switch SAn-1 is turned ON, the positive-phase-side first switch SAn-1 corresponding to the first input terminal Tn-1 to which the lower-side voltage VCn-1 of the battery cell Cn is inputted, and the negative-phase-side first switch SBn is turned on, the negative-phase-side first switch SBn corresponding to the first input terminal Tn to which the upper-side voltage VCn of the battery cell Cn is inputted. As a result, the lower-side voltage VCn-1 of the battery cell Cn is outputted to the output terminal TO1A via the first input terminal Tn-1 and the switch SAn-1, and the upper-side voltage VCn of the battery cell Cn is outputted to the output terminal TO1B via the first input terminal Tn and the switch SBn.

Accordingly, electric charge corresponding to a voltage decrease from the upper-side voltage VCn to the lower-side voltage VCn-1 is discharged from the positive-phase-side first capacitor C11A, such that electric charge corresponding to the lower-side voltage VCn-1 is stored in the positive-phase-side first capacitor C11A. At the time, the electric charge corresponding to the voltage decrease moves from the positive-phase-side first capacitor C11A to the positive-phase-side second capacitor C21 since the second switch S21 is OFF. Meanwhile, the negative-phase-side first capacitor C11B is charged with electric charge corresponding to a voltage increase from the lower-side voltage VCn-1 to the upper-side voltage VCn, such that electric charge corresponding to the upper-side voltage VCn is stored in the negative-phase-side first capacitor C11B. At the time, the electric charge corresponding to the voltage increase moves from the negative-phase-side second capacitor C22 to the negative-phase-side first capacitor C11B since the second switch S22 is OFF.

In the above manner, a differential voltage from the upper-side voltage VCn to the lower-side voltage VCn-1, i.e., the positive-phase voltage of the battery cell Cn, is applied to the positive-phase-side second capacitor C21. Then, the applied voltage is outputted as the positive-phase-side output voltage VOA from the differential amplifier 30b. Similarly, a differential voltage from the lower-side voltage VCn-1 to the upper-side voltage VCn, i.e., the negative-phase voltage of the battery cell Cn, is applied to the negative-phase-side second capacitor C22. Then, the applied voltage is outputted as the negative-phase-side output voltage VOB from the differential amplifier 30b. In this manner, positive electric charge and negative electric charge that are in the same amount are stored in the pair of second capacitors C21 and C22. Accordingly, the gain of the output voltage VO obtained by outputting the difference between the positive-phase-side output voltage VOA and the negative-phase-side output voltage VOB (VOA−VOB) as the output voltage VO can be doubled. Then, at the time t5, the first switches SAn-1 and SBn are turned OFF and the second switches S21 and S22 are turned ON, and thereby electric charge is discharged from the first capacitors C11A, C11B and the second capacitors C21, C22, so that the switches are reset to the initial state. Thereafter, the voltages of the other battery cells Cj are sequentially measured in the same manner (e.g., the voltage of a battery cell C1 is measured in a period from a time t6 to a time t10).

The following period from the time t10 to a time t14 indicates a period during which measurement is performed on a management-voltage-measuring power supply PSm. At the time t10, the second switches S21 and S22 are turned ON to discharge electric charge from the first capacitors C11A, C11B, C12A, C12B and the second capacitors C21, C22, so that the switches are reset to the initial state. Also, the third switches S32A and S32B corresponding to the second multiplexer 22b are turned OFF. Thereafter, at the time t11, the third switches S31A and S31B corresponding to the first multiplexer 21b are turned ON. In addition, the positive-phase-side first switch SAAm is turned ON, wherein the positive-phase-side first switch SAAm corresponds to a second input terminal TAm to which the upper-side voltage VAm of the management-voltage-measuring power supply PSm is inputted. Moreover, a negative-phase-side first switch SABm-1 is turned ON, wherein the negative-phase-side first switch SABm-1 corresponds to a second input terminal TAm-1 to which the lower-side voltage VAm-1 of the management-voltage-measuring power supply PSm is inputted.

As a result, the upper-side voltage VAm of the management-voltage-measuring power supply PSm is outputted to the output terminal TO2A via the input terminal TAm and the switch SAAm, and the lower-side voltage VAm-1 of the management-voltage-measuring power supply PSm is outputted to the output terminal TO2B via the input terminal TAm-1 and the switch SABm-1. The first capacitors C12A and C12B are charged in accordance with the voltages VAm and VAm-1 outputted from the respective output terminals TO2A and TO2B. At the time, the voltages at the outputs of the first multiplexer 21b and the voltages at the first capacitors C11A and C11B corresponding to the outputs of the first multiplexer 21b are the reference voltage (ground voltage) since the third switches S31A and S31B are ON. This prevents the voltages at the first capacitors C11A and C11B from varying due to noise or the like, and prevents the voltages at the first capacitors C12A and C12B connected to one ends of the first capacitors C11A and C11B from varying. It should be noted that the third switches S31A and S31B maintain their ON state while the voltages VAq of the plurality of management-voltage-measuring power supplies PSp are being measured (i.e., while switching operations in the second multiplexer 22b are continuing).

Subsequently, from the time t12 to the time t14, similar to the period from the time t3 to the time t5, the lower-side voltage VAm-1 of the management-voltage-measuring power supply PSm is applied to the first capacitor C12A, and thereby a differential voltage from the upper-side voltage VAm to the lower-side voltage VAm-1 is applied to the second capacitor C21. Then, the applied voltage is outputted as the output voltage VOA from the differential amplifier 30b. Similarly, the upper-side voltage VAm of the management-voltage-measuring power supply PSm is applied to the first capacitor C12B, and thereby a differential voltage from the lower-side voltage VAm-1 to the upper-side voltage VAm is applied to the second capacitor C22. Then, the applied voltage is outputted as the output voltage VOB from the differential amplifier 30b. Finally, a difference between the positive-phase-side output voltage VOA and the negative-phase-side output voltage VOB (VOA−VOB) is outputted as the output voltage VO. Thereafter, the voltages of the other management-voltage-measuring power supplies PSp are sequentially measured in the same manner (e.g., the voltage of a management-voltage-measuring power supply PS1 is measured in a period from a time t15 to a time t20).

As described above, the above configuration makes it possible to measure the voltage between selected input terminals (i.e., the voltage of each battery cell Cj or the voltage of each management-voltage-measuring power supply PSp) in a manner to invert the polarity. Therefore, the voltage measurement can be performed with a higher precision.

Also in the present embodiment, first switches SAi and SBi included in the first multiplexer 21b are configured as high-voltage switches that allow operation at a voltage higher than the operating voltage of first switches SAAq and SABq included in the second multiplexer 22b. Accordingly, the capacity of the first capacitors C11A and C11B connected to the first multiplexer 21b is higher than the capacity of the first capacitors C12A and C12B connected to the second multiplexer 22b. Specifically, the low-voltage first switches SAAq and SABq have ordinary voltage-withstanding performance, i.e., withstanding approximately 5 V. The high-voltage first switches SAi and SBi include switches larger than the low-voltage first switches SAAq and SABq. Generally speaking, the high-voltage first switches SAi and SBi withstand approximately 20 V or higher.

Also in the present embodiment, the positive-phase-side high-voltage first switches SAi may be configured in such a manner as described in Embodiment 1 as shown in FIG. 3. In this case, the positive-phase-side low-voltage first switches SAAq may be configured in such a manner as described in Embodiment 1 as shown in FIG. 4. Similarly, the negative-phase-side high-voltage first switches SBi may be configured in such a manner as shown in FIG. 3, and the negative-phase-side low-voltage first switches SABq may be configured in such a manner as shown in FIG. 4. Further alternatively, the high-voltage first switch SAi-2 shown in FIG. 5 may be applied as the positive-phase-side high-voltage first switches SAi and the negative-phase-side high-voltage first switches SBi. In this case, the low-voltage first switch SAAq-2 shown in FIG. 6 may be applied as the positive-phase-side low-voltage first switches SAAq and the negative-phase-side low-voltage first switches SABq. Further alternatively, one of the configurations shown in FIG. 3 and FIG. 5 may be applied to the positive-phase-side high-voltage first switches SAi, and the other one of the configurations shown in FIG. 3 and FIG. 5 may be applied to the negative-phase-side high-voltage first switches SBi. In this case, one of the configurations shown in FIG. 4 and FIG. 6 may be applied to the positive-phase-side low-voltage first switches SAAq, and the other one of the configurations shown in FIG. 4 and FIG. 6 may be applied to the negative-phase-side low-voltage first switches SABq.

As described above, also in the present embodiment, the high-voltage first switches SAi and SBi have such a circuit configuration as shown in FIG. 3 or FIG. 5, and the low-voltage first switches SAAq and SABq have such a circuit configuration as shown in FIG. 4 or FIG. 6. Accordingly, the circuit area of the high-voltage first switches SAi and SBi including their controllers is approximately 10 times or more as large as the circuit area of the low-voltage first switches SAAq and SABq including their controllers. Therefore, as described above, the circuit area of the entire voltage measuring device 10b can be reduced by reducing the number of high-voltage first switches SAi and SBi as much as possible.

Although the embodiments of the present invention have been described above, the present invention is not limited to the above embodiments, and various improvements, alterations, and modifications can be made to the above embodiments without departing from the spirit of the present invention. For example, components in the plurality of above-described embodiments may be combined in any manner. It has been described in the above embodiments that the plurality of multiplexers forming the switching unit are the two multiplexers 21, 22 or the two multiplexers 21b, 22b. However, three or more multiplexers may form the switching unit. Moreover, the configurations of the high-voltage switches and the low-voltage switches used as the first switches are not limited to the configurations shown in FIG. 3, FIG. 4, FIG. 5, and FIG. 6. Various configurations are applicable in accordance with the voltage, specifications, etc., of the battery cell array 1 subjected to the voltage measurement.

From the foregoing description, numerous modifications and other embodiments of the present invention are obvious to one skilled in the art. Therefore, the foregoing description should be interpreted only as an example and is provided for the purpose of teaching the best mode for carrying out the present invention to one skilled in the art. The structural and/or functional details may be substantially altered without departing from the spirit of the present invention.

<Industrial Applicability>

The voltage measuring device according to the present invention is useful to suppress an increase in circuit area even if there is an increase in the number of management-voltage-measuring power supplies to be incorporated in the voltage measuring device.

What is claimed is:

1. A voltage measuring device comprising:
    a switching unit configured such that, in order to measure a voltage of each battery cell in a battery cell array in which a plurality of battery cells are connected in series, voltages at connecting ends of the plurality of battery cells are inputted to the switching unit,
        a voltage of at least one management-voltage-measuring power supply provided separately from the plurality of battery cells is inputted to the switching unit, and
        the switching unit outputs one of the inputted voltages; and
    a signal processor configured to perform operational processing on the voltage of each battery cell based on an inter-cell voltage between the plurality of battery cells, the inter-cell voltage being outputted from the switching unit, wherein
    the switching unit includes a plurality of multiplexers each including:
        a plurality of input terminals;
        an output terminal configured to output one of voltages inputted from the plurality of input terminals; and
        a plurality of first switches provided for the respective input terminals and provided between the plurality of input terminals and the output terminal, the plurality of first switches selectively connecting one of the input terminals to the output terminal,
    the signal processor includes:
        a plurality of first capacitors provided for the respective output terminals of the plurality of multiplexers, the first capacitors having their one ends connected to the respective output terminals of the multiplexers, the first capacitors being charged in accordance with voltages outputted from the respective output terminals;
        a differential amplifier including an inverting input terminal and a non-inverting input terminal, one input terminal of which is connected to the other ends of the first capacitors;
        a second capacitor connected between the one input terminal and an output terminal of the differential amplifier; and
        a second switch connected parallel to the second capacitor, and
    the first switches included in at least one of the plurality of multiplexers are configured as high-voltage switches that allow operation at a voltage higher than an operating voltage of the first switches included in the other multiplexer or multiplexers.

2. The voltage measuring device according to claim 1, comprising a voltage disconnector provided between the first switches and the first capacitors, the voltage disconnector being configured such that, when an output from one of the multiplexers is inputted to the differential amplifier, the voltage disconnector disconnects an output from the other multiplexer or multiplexers.

3. The voltage measuring device according to claim 2, wherein the voltage disconnector includes third switches configured to cause voltages between the first switches and the first capacitors to become a predetermined reference voltage.

4. The voltage measuring device according to claim 1, wherein
    the plurality of multiplexers include:
        a first multiplexer including a plurality of first input terminals, to which the voltages at all of the connecting ends of the plurality of battery cells in the battery cell array are inputted; and
        a second multiplexer including at least one second input terminal, to which the voltage of the at least one management-voltage-measuring power supply is inputted, wherein
    the first switches included in the first multiplexer are configured as high-voltage switches that allow operation at a voltage higher than an operating voltage of the first switches included in the second multiplexer.

5. The voltage measuring device according to claim 1, wherein
    the output terminal of each multiplexer is configured as a pair of output terminals;
    each first switch of the multiplexer includes:
        a positive-phase-side switch configured to connect or disconnect between one of the plurality of input terminals and one of the pair of output terminals; and
        a negative-phase-side switch configured to connect or disconnect between the one of the plurality of input terminals and the other one of the pair of output terminals.

6. The voltage measuring device according to claim 1, wherein
- the high-voltage switches each include at least one high-voltage MOS transistor,
- the other first switches each include at least one low-voltage MOS transistor, and
- an area of each high-voltage MOS transistor is five times or more as large as an area of each low-voltage MOS transistor.

* * * * *